United States Patent [19]
Balz et al.

[11] Patent Number: 5,927,193
[45] Date of Patent: Jul. 27, 1999

[54] PROCESS FOR VIA FILL

[75] Inventors: James G. Balz, Walden; Cynthia J. Calli, Newburgh; Jon A. Casey, Poughkeepsie; David C. Long, Wappingers Falls; Daniel S. Mackin, Pleasant Valley; Keith C. O'Neil, Hughsonville; Brenda L. Peterson, Wappingers Falls; Glenn A. Pomerantz, Kerhonkson, all of N.Y.

[73] Assignee: International Business Machines Corporation, Armonk, N.Y.

[21] Appl. No.: 08/951,704

[22] Filed: Oct. 16, 1997

[51] Int. Cl.[6] .................................... B41M 1/12
[52] U.S. Cl. .......................... 101/129; 101/126
[58] Field of Search .................... 101/114, 123, 101/124, 126, 127, 127.1, 129

[56] References Cited

U.S. PATENT DOCUMENTS

| | | | |
|---|---|---|---|
| 3,486,441 | 12/1969 | Hillman et al. . | |
| 3,769,908 | 11/1973 | Griffin . | |
| 4,068,994 | 1/1978 | Cadwallader et al. | 101/126 |
| 4,084,506 | 4/1978 | Nakatani . | |
| 4,173,928 | 11/1979 | Mitter | 101/126 |
| 4,784,310 | 11/1988 | Metzger et al. . | |
| 4,803,110 | 2/1989 | Ahn et al. . | |
| 4,902,371 | 2/1990 | Andris et al. . | |
| 4,964,335 | 10/1990 | Klemm | 101/126 |
| 5,003,870 | 4/1991 | Isaak . | |
| 5,195,434 | 3/1993 | Hoffman | 101/126 |
| 5,249,520 | 10/1993 | Andris et al. . | |
| 5,308,645 | 5/1994 | Zachman et al. | 101/126 |
| 5,323,701 | 6/1994 | Sommer | 101/126 |
| 5,332,439 | 7/1994 | Watanabe et al. | 101/123 |
| 5,394,796 | 3/1995 | Jones et al. | 101/129 |

*Primary Examiner*—Ren Yan
*Attorney, Agent, or Firm*—Delio & Peterson LLC; John J. Tomaszewski; Aziz M. Ahsan

[57] ABSTRACT

An apparatus and method is provided for vacuum screen printing a greensheet having vias and both vias and open areas whereby vacuum leakage in the apparatus is minimized and avoids bowing of the screen over the open area of the greensheet. An interposer apparatus is provided comprising at least two layers having vertical through openings in registration with the via openings of the greensheet and screen. The interposer also comprises vertical through openings communicating with the open area of the greensheet and with vent channels of the interposer. A porous membrane is also used either alone or in conjunction with the interposer to provide enhanced screening results.

10 Claims, 4 Drawing Sheets

PROCESS FOR VIA FILL

BACKGROUND OF THE INVENTION

1. Field of the Invention

The present invention relates generally to an apparatus and method in a screening process for printing patterns on electronic components and other substrates, and, more particularly, to vacuum assisted screening greensheet substrates containing vias and both vias and large openings which greensheets are used to make a cavity multilayer ceramic package.

2. Description of Related Art

The use of a mask, template or stencil to control the pattern for material deposition on a structure is well known. Some structures are electronic components such as multilayer ceramic components and the disclosure will be directed to such components for convenience. The term "mask" will be used herein to refer to a mask, template, stencil or other structure containing a pattern to be transferred to a substrate.

Generally, openings are provided in a sheet of material to be used as a mask in the pattern which corresponds to the desired pattern to be imparted onto a structure such as a greensheet. Such a mask is placed against the structure surface and deposition of a patterning material on the selected portions of the surface through the mask openings are made. Typical electronic component structures upon which material depositions are made are integrated circuit wafers, greensheets and substrates which are used to mount thereupon various kinds of electronic devices.

The fabrication of multilayer ceramic semiconductor packages is well known and is generally made by stacking and bonding together flexible paper-like sheets commonly referred to as greensheets. Greensheet segments of desired size and configuration are punched to provide via holes which interconnect the various package layers and, by a screen printing technique, a conductive paste fills the via holes and a via connecting conductive circuit pattern is applied to the face of the greensheet as required. Such greensheets, after screening, are assembled in a stack, pressed and subsequently sintered in an oven at a relatively high temperature.

Critical to the fabrication process is the screening operation since the ceramic greensheet or other substrates are typically relatively fragile and the design must be closely controlled because of the low pattern tolerances for these type electronic components.

There are a variety of masks which may be used for screen printing and an emulsion-treated wire mesh screen is commonly used with and without metal foils to screen print vias and conductive patterns on the surfaces of ceramic and other substrates in the process of manufacturing electrical circuit devices. In the typical screen printing process, the screen is treated with an emulsion to render it impervious to the through-flow of the printing substance. The emulsion is dried and thereafter removed in pre-selected areas which correspond to the pattern to be printed. The design is typically formed using photolithographic techniques as is well known in the art. The screen having the pattern thereon is placed over the printing surface of the substrate and a printing substance is deposited onto the screen frame. An automatic or semi-automatic screen printing system is actuated to move a flexible squeegee across the screen to push the printing substance through the areas of the screen which have been made pervious by emulsion removal.

A typical printing screen comprises a network or mesh of fine wires which have been treated with an emulsion to render the screen impervious to the fabrication substance. A typical screen is made of crossing wires of about 0.7 mil to 4.5 mil thickness. A metal foil is typically bonded to the screen to give the screen greater accuracy for small and/or delicate patterns and to provide a "snap-off" effect for cleanly removing the screen from the substrate after the squeegee passes over the screen.

When the greensheet or other electronic component substrate has vias, especially vias having a high via height to via diameter ratio, a vacuum chuck is usually required to both hold the greensheet in place and provide a vacuum to "pull" metal paste into the vias for a complete via fill. Vacuum assisted via-fill, however, can result in the patterning material passing through the via and surrounding the back side of the via. Further, when screening substrates that contain via openings and also large openings such as to make a cavity package, the mesh screen gets sucked down into the cavity opening of the greensheet during the screening operation because of the vacuum. This bowing of the screen causes the mask when lifted off the greensheet, to abruptly separate at the cavity openings resulting in splattering and possibly damaging the mask and the coated circuit pattern on the substrate surface. Blocking the vacuum from the large openings of the electronic component substrate has not been found to be effective because of the lateral migration of the vacuum through the greensheet and the vacuum blocking device.

A number of patents have issued in this area including U.S. Pat. Nos. 3,486,441; 3,769,908; 4,084,506; 4,784,310; 4,803,110; 4,902,371; 5,003,870 and 5,249,520. The disclosures of all the above patents are incorporated herein by reference.

Bearing in mind the problems and deficiencies of the prior art, it is therefore an object of the present invention to provide a vacuum assisted apparatus for screen printing a greensheet or other electronic component substrate having vias and substrates and greensheets having both an open area and vias.

A further object of the invention is to provide a method for vacuum assisted screen printing a greensheet or other electronic component substrate having vias and substrates and greensheets having both an open area and vias.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an apparatus comprising a vacuum chuck having a layer of a porous membrane disposed thereon between the vacuum area of the chuck and a greensheet or other via containing substrate disposed on the surface of the porous membrane. The porous membrane is characterized by a number of properties depending on the application such as surface smoothness, resistance to the patterning material, pore size, etc. with the proviso that the porous membrane sheet provide a backing to the substrate being printed so that the patterning material does not flow through the vias and deposit on the lower surface of the substrate.

In a further aspect of the invention, an apparatus is provided for screen printing a greensheet having vias and/or both an open area and vias and comprises a two layer interposer device disposed on the vacuum chuck wherein the open areas of the greensheet exposed to the vacuum are vented to the atmosphere and for other areas to be patterned such as the vias, through hole openings in the interposer are in communication with the via openings of the greensheet and the vacuum area of the vacuum chuck. Using this apparatus, the open area is not exposed directly to the vacuum and the mesh screen over the open area is not sucked into the open area so as to cause the patterning material to splatter and possibly damaging the mask among other problems associated with the vacuum screen printing of electronic component substrates having large open areas.

In another aspect of the invention, an apparatus comprising both a porous membrane and interposer provides enhanced vacuum screen printing results for via containing substrates.

A method is also provided to effectively screen print a greensheet or other electronic component having vias and/or and open area and vias using the porous membrane apparatus and interposer apparatus of the invention.

Broadly stated, an apparatus is provided for screen printing a substrate such as a greensheet having vias and/or an open area and vias comprising:

a vacuum chuck for applying a vacuum to the greensheet; and a two-layer interposer disposed on the vacuum chuck comprising:
   a lower layer having a plurality of horizontal first channels extending to at least one end of the lower layer which end is open to the atmosphere and a plurality of first vertical through openings with the first channels and first vertical through openings separate and not communicating with each other; and
   an upper layer having a plurality of second vertical through openings and third vertical through openings, the first vertical through openings and second vertical through openings being in registration and communicating with the vacuum of the vacuum chuck and the vias of the greensheet and the third vertical through openings communicating with the horizontal first channels and the open area of the greensheet.

For electronic component substrates with a density of via-fill sites such that an adequate size horizontal channel cannot be used or made in the above two-layer interposer device, multiple crisscrossing channels may be used.

When the density of the via-fill sites is greater yet and a channel or plurality of channels is not totally effective, it is a preferred feature of the invention that the interposer apparatus comprise additional layers, in particular, a three layer interposer. In such a three layer interposer, an apparatus is provided for screen printing a greensheet having vias and/or an open area and vias comprising:

a vacuum chuck for applying a vacuum to the greensheet; and a three layer interposer disposed on the vacuum chuck comprising:
   a lower layer having a plurality of horizontal first channels extending to at least one end of the lower layer which end is open to the atmosphere and a plurality of first vertical through openings, the channels and vertical through openings not communicating and the first vertical through openings communicating with the vacuum of the vacuum chuck;
   an intermediate layer having a plurality of horizontal second channels, a plurality of communicating vertical openings extending to the channels and to the opposed layer of the intermediate layer and a plurality of intermediate vertical through openings communicating with the first channels; and
   an upper layer having a plurality of second vertical through openings and a plurality of third vertical through hole openings, the second vertical through hole openings communicating with the horizontal second channels and in registration with the vias of the greensheet and the third vertical through hole openings in registration with the intermediate vertical through hole openings and in communication with the open area of the greensheet.

A method is also provided to use the two layer interposer apparatus of the invention to fabricate greensheets by a screen printing process comprising:

supplying a vacuum chuck;

positioning a two-layer interposer on the vacuum chuck, the interposer comprising:
   a lower layer having a plurality of horizontal first channels extending to at least one end of the lower layer which end is open to the atmosphere and a plurality of first vertical through openings with the first channels and first vertical through openings separate and not communicating with each other; and
   an upper layer having a plurality of second vertical through openings and third vertical through openings, the first vertical through openings and second vertical through openings being in registration and communicating with the vacuum of the vacuum chuck and the vias of the greensheet and the third vertical through openings communicating with the horizontal first channels and the open area of the greensheet;

positioning a greensheet on the interposer;

positioning a patterned screen having openings therein on the greensheet;

applying a metallic paste to the surface of the screen; and applying a vacuum to the vacuum chuck and forcing the metallic paste through the openings in the screen and forming the desired pattern on the greensheet.

A method is also provided to use the three layer interposer apparatus of the invention to fabricate greensheets by a screen printing process comprising:

supplying a vacuum chuck;

positioning a three-layer interposer on the vacuum chuck, the interposer comprising:
   a three layer interposer disposed on the vacuum chuck comprising:
      a lower layer having a plurality of horizontal first channels extending to at least one end of the lower layer which end is open to the atmosphere and a plurality of first vertical through openings, the channels and vertical through openings not communicating and the first vertical through openings communicating with the vacuum of the vacuum chuck;
      an intermediate layer having a plurality of horizontal second channels, a plurality of communicating vertical openings extending to the channels and to the opposed layer of the intermediate layer and a plurality of intermediate vertical through openings communicating with the first channels; and
      an upper layer having a plurality of second vertical through openings and a plurality of third vertical through hole openings, the second vertical through hole openings communicating with the horizontal second channels and in registration with the vias of the greensheet and the third vertical through hole openings in registration with the intermediate vertical through hole openings and in communication with the open area of the greensheet;

positioning a greensheet on the interposer;

positioning a patterned screen having openings therein on the greensheet;

applying a metallic paste to the surface of the screen; and applying a vacuum to the vacuum chuck and forcing the metallic paste through the openings in the screen and forming the desired pattern on the greensheet.

In an additional aspect of the invention, a porous membrane sheet is used between the interposer device and the greensheet or other substrate being patterned.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
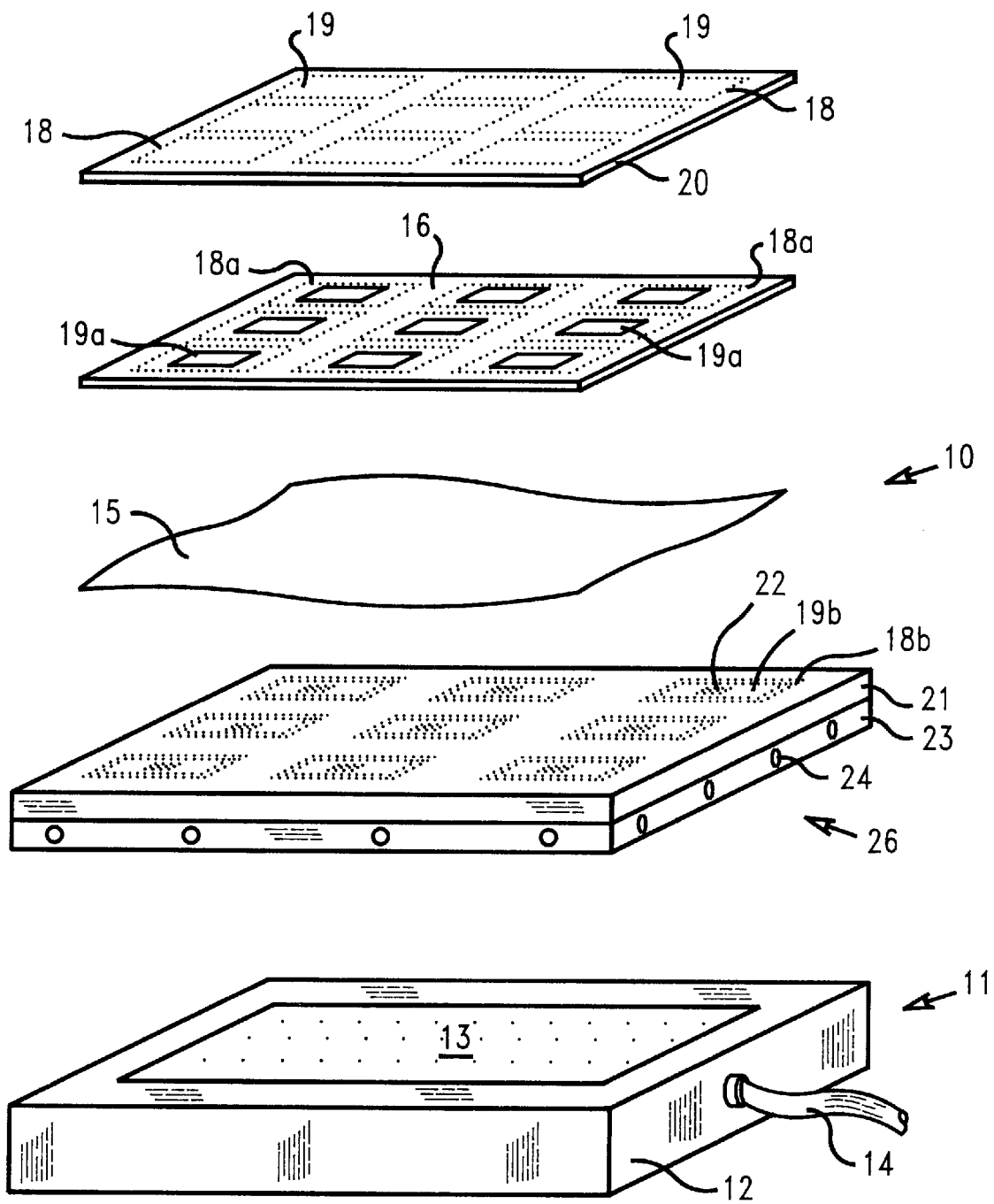
FIG. 1 is an exploded view of a greensheet with cavity and via openings used with a vacuum chuck and with both a porous membrane backing sheet and interposer apparatus of the invention.

In describing the preferred embodiment of the present invention, reference will be made herein to FIGS. 1–6B of the drawings in which like numerals refer to like features of the invention. Features of the invention are not necessarily shown to scale in the drawings.

Figure 6A:
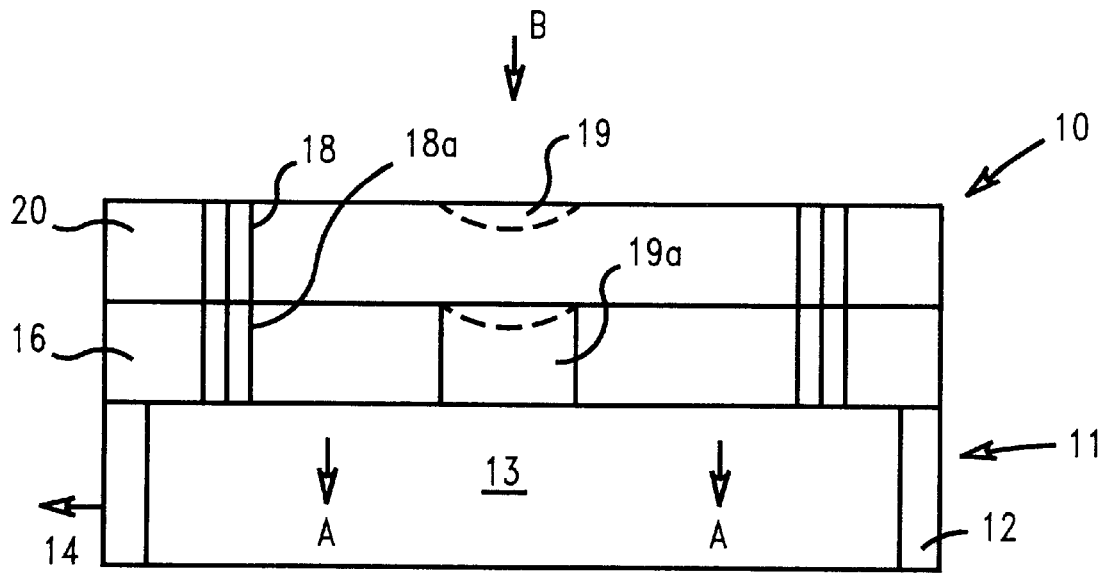
FIG. 6A is a schematic side view of a conventional vacuum chuck apparatus of the invention used to screen print a substrate having via openings and an open area.

Referring first to FIG. 6A which shows a conventional screen printing apparatus using a vacuum chuck of the prior art, the problem of screen printing greensheets having large open areas is readily apparent. The apparatus shown generally as 10 comprises a vacuum chuck shown generally as 11 which has vertical structural member 12 forming an open area 13. When a vacuum 14 is applied to the vacuum chuck apparatus 11, a vacuum is provided in area 13 and air would be sucked down through openings in the overlying components in the direction as shown by arrows A and B.

In the typical method of using the apparatus 10, a greensheet 16 placed on vacuum chuck 11 and a printing screen 20 disposed on the top of greensheet 16. The greensheet 16 and screen 20 have registering via openings 18 and 18a, respectively. The greensheet 16 has an open area 19a. When the screen is in position and a paste is to be applied to the screen for transfer to the greensheet, a vacuum 14 is applied and downward forces are provided on the surface of the screen as shown by arrows B. In open areas of the screen 20, shown by via openings 18, the paste or other transfer medium would pass through openings 18 into greensheet via openings 18a to fill the vias. In the corresponding open area 19a of the greensheet, the printing screen 20 will not have an open area since no paste is desired to be coated at that part of the greensheet and the vacuum will cause the screen to bow into opening 19a as shown by the dotted line. After the screening operation and the vacuum is removed, the screen will be removed from the greensheet and the portion of the screen 20 which was sucked into greensheet opening 19a may cause splattering or any of the problems noted above. It is the purpose of the invention to provide an apparatus and method for avoiding and/or minimizing the bowing of the screen into open areas 19a of the greensheet thereby avoiding the problems of the prior art.

Figure 6B:
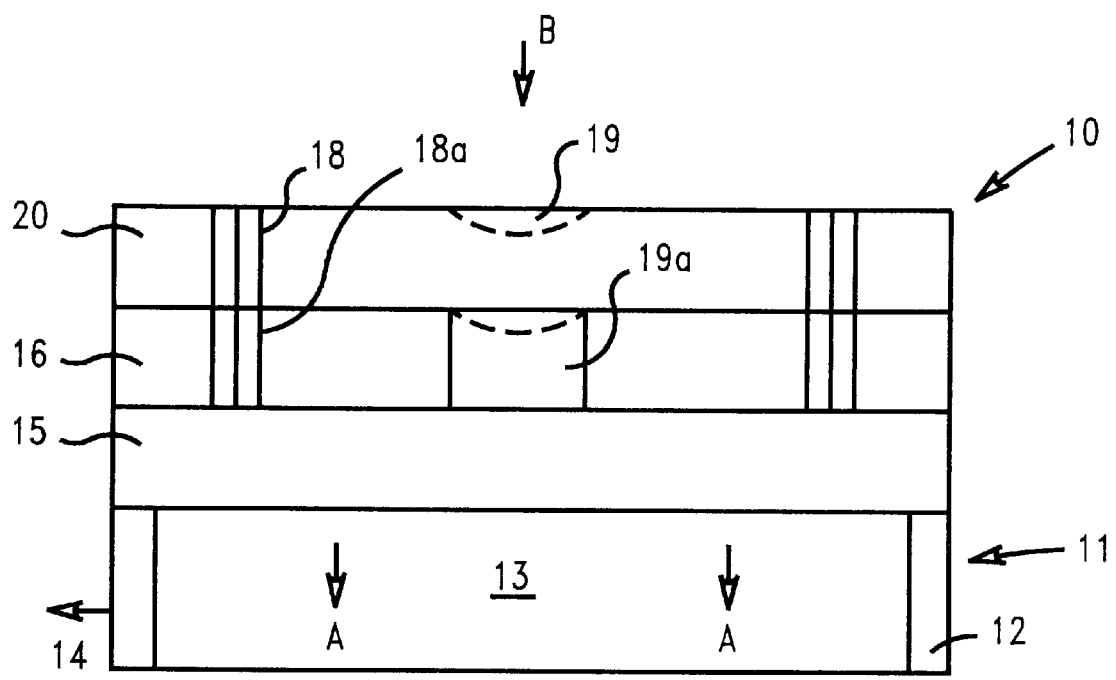
FIG. 6B is a schematic side view of a backing sheet apparatus of the invention used to screen print a substrate having via openings an open area.

Referring to FIG. 6B, the apparatus of the prior art has been improved by using a porous membrane backing sheet 15. The use of sheet 15 controls the via fill by effectively keeping the metal paste or other printing media from going through the vias 18a to the bottom of greensheet 16. Also the bowing effect in open area 19a may be minimized in certain fabrication procedures.

Referring now to FIG. 1, a preferred apparatus of the invention is shown generally as 10. A screen 20 is disposed on greensheet 16 and porous membrane backing sheet 15 disposed on a two layer interposer of the invention shown generally as 26. The interposer 26 is disposed on top of vacuum chuck 12 shown generally as 11.

Screen 20 has via openings 18. The remainder of the screen is shown without openings including an area shown between vias 18 as area 19. Typically, the screen will have other pattern designs thereon such as conductor lines between the vias.

Screen 20 is placed in registration with greensheet 16. Open area 19a and vias 18a are in registration with area 19 and vias 18 of screen 20. A porous backing sheet 15 underlies greensheet 16.

An interposer apparatus shown generally as 26 comprises an upper layer 21 and a lower layer 23. Upper layer 21 has an area 19b corresponding to open area 19a and area 19 and vertical through holes 18b corresponding and in registration with vias 18a and 18. In area 19b there are through hole openings 22 which extend from the top to the bottom of upper layer 21. The interposer apparatus 26 as shown also comprises lower layer 23 having vacuum vents 24 which vent to the atmosphere as will be more fully described hereinbelow. The interposer apparatus 26 is disposed on the surface of vacuum chuck shown generally as 11. The vacuum chuck 11 comprises a base 12 having an area 13 therein. A vacuum 14 when applied to the vacuum chuck will produce a vacuum in open area 13.

Figure 2:
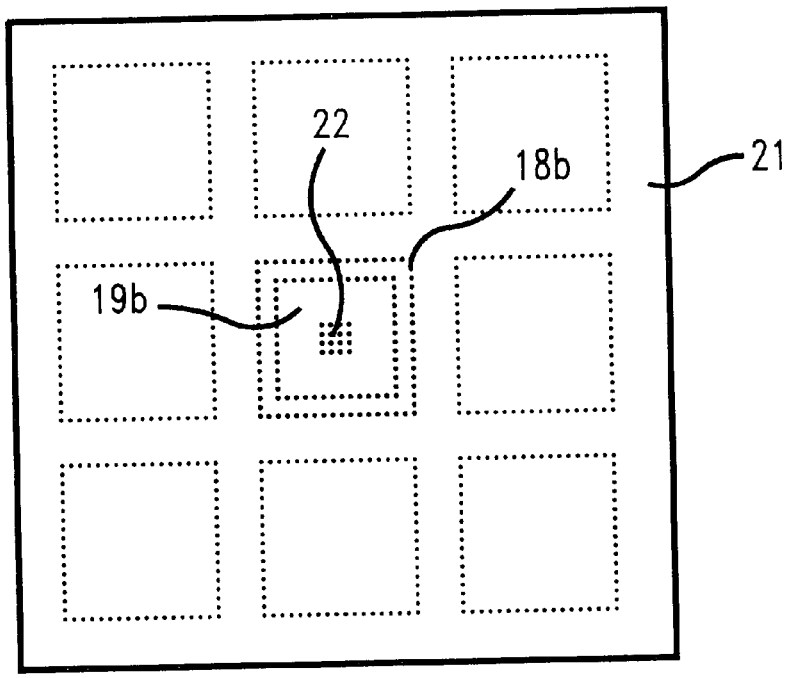
FIG. 2 is a top plan view of the upper layer of the interposer apparatus of the invention shown in FIG. 1.

Referring now to FIG. 2 which is a top plan view of upper layer 21 of interposer 26, the upper layer 21 contains a plurality of openings corresponding to the greensheet 16 and screen 20. For clarity, via openings and vent openings are shown only in the center portion of the layer for both FIGS. 2 and 3. Thus, upper layer 21 comprises a series of vertical through openings 18b which are in registration with via openings 18a of greensheet 16 and via openings 18 of screen 20. The through openings 18b extend from the top to the bottom of upper layer 21. Enclosed within the periphery of the via openings 18b is an area 19b which has a plurality of vertical through hole openings 22 therein.

Figure 3:
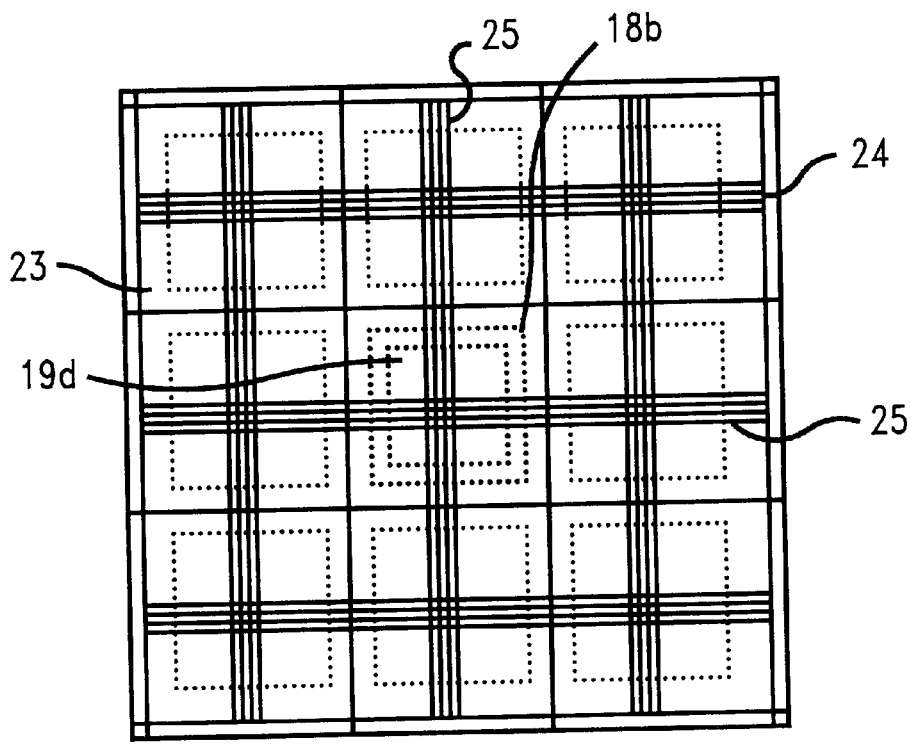
FIG. 3 is a top plan view of the lower layer of the interposer apparatus of the invention shown in FIG. 1.

Referring now to FIG. 3, the lower layer of interposer 26 is shown as 23 and, like upper layer 21, comprises a series of openings "corresponding" to the upper layer of interposer 26 and greensheet 16 and screen 20. Thus, the lower layer 23 has a series of vertical through openings 18d which are in registration with vertical through hole openings 18b, vias 18a and screen openings 18. An area 19d is shown within the periphery of through holes 18d and area 19d is in registration with open area 19a of greensheet 16. A series of crossing horizontal channels 25 are shown extending from one end of lower layer 23 to the other end in transverse directions. The channels 25 terminate at openings 24 which are preferably exposed to the atmosphere.

Figure 4:
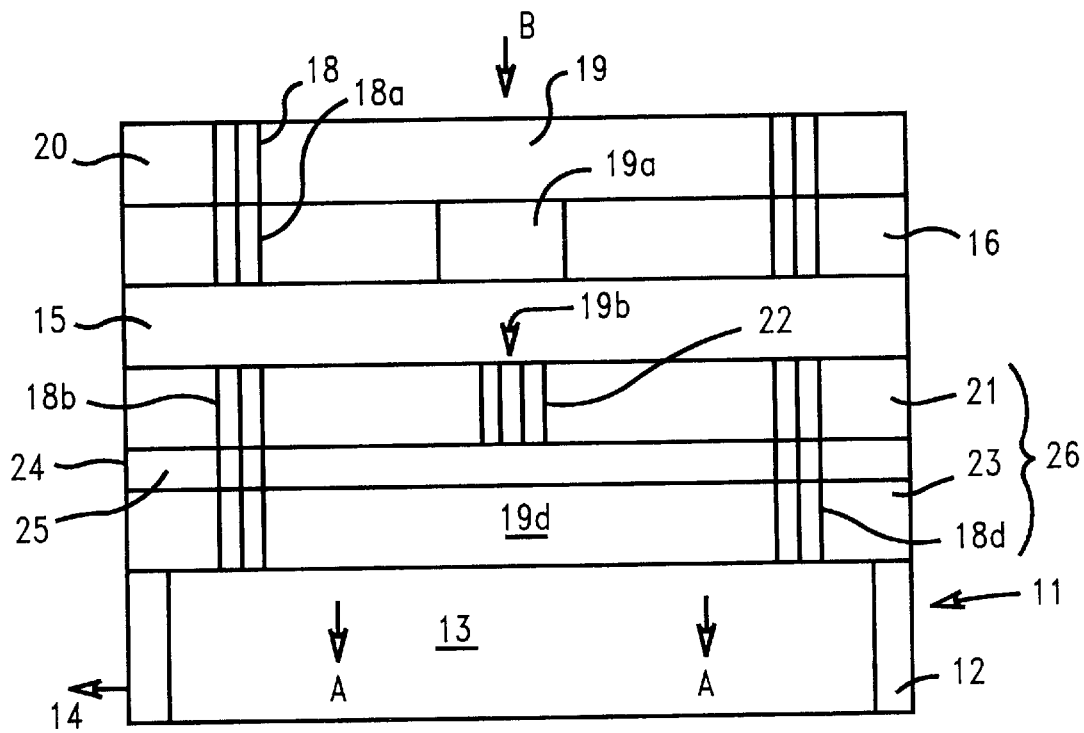
FIG. 4 is a side schematic view of the interposer and backing sheet apparatus of the invention used to screen print a greensheet having an open area and vias.

Referring now to FIG. 4, the use of the interposer apparatus 26 to screen a greensheet 16 may be demonstrated. A vacuum chuck shown generally as 11 having a base 12 and an open area therein 13 is positioned on typically on a table (not shown) to support the vacuum chuck for the screening operation. The vacuum chuck has a vacuum port 14 which, when the vacuum is applied thereto, produces a vacuum in area 13 providing a downward force on interposer 26, porous sheet 15, greensheet 16 and screen 20 as shown by arrows A and B.

The interposer shown as 26 is placed on the surface of vacuum chuck 11. The lower layer 23 of interposer 26 comprises a plurality of vertical through holes 18d and a plurality of non-communicating horizontal channels 25 extending from one end of lower layer 23 to the other end and which channels terminate to the atmosphere at 24. An upper layer 21 is disposed on the surface of lower layer 23 and comprises a plurality of vertical through holes 18b in registration with vertical through holes 18d. A series of vertical through holes 22 (shown in area 19b) communicate with horizontal channels 25. A porous membrane sheet 15 is then preferably placed on the top of upper layer 21.

A greensheet 16 is placed on the surface of porous sheet 15 and comprises a series of via through hole openings 18a and open area 19a. The via openings 18a are in registration with interposer through hole openings 18b and 18d. Similarly, the open area 19a of greensheet 16 overlies area 19b of upper layer 21. A screen 20 is placed on the surface of greensheet 16 and comprises a plurality of via openings 18. The screen has only these via openings 18 so that when a paste is applied to the surface and a squeegee used to force the paste through the pattern openings, the paste will only be forced into via openings 18. Via openings 18 are in registration with via openings 18a of greensheet 16. It will be noted that area 19 of screen 20 is impervious to the paste (has no openings) so that paste will not be forced into open area 19a of greensheet 16.

When a vacuum is applied through vacuum line 14, a downward force is applied to the assembly as shown by arrows B. As shown in FIG. 6 of the prior art, the area of screen 16 shown as 19 which overlies open area 19a of greensheet 16 would be sucked down into open area 19a causing mask and screening material transfer difficulties during the screening operation and when the screen is removed from the greensheet. Using the interposer apparatus 26 of the invention, this problem is avoided because no significant vacuum force is applied to the areas designated as 19 and 19a due to the interposer apparatus 26. Thus, any vacuum which may be applied by leakage or otherwise to open area 19a is vented by vertical through openings 22 in upper layer 21 of interposer 26 which openings are in communication with horizontal channels 25 of lower layer 23. The via openings shown as 18 and 18a are easily filled with the patterning material because they are in communication with vertical through hole openings 18b and 18d of interposer 26 which openings are in communication with vacuum area 13 of vacuum chuck 11.

Figure 5:
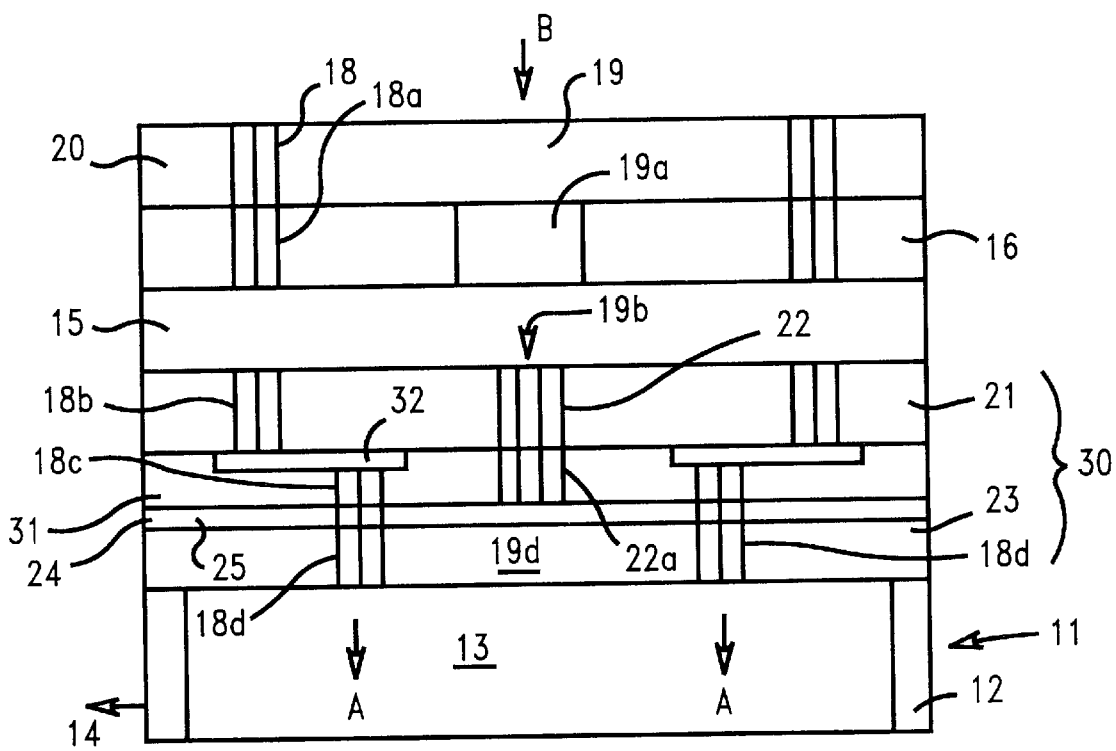
FIG. 5 is a schematic side view of a three layer interposer and backing sheet apparatus of the invention used to screen print a greensheet having vias and an open area.

When the density of the via-fill sites are such that an adequate size horizontal channel for venting cannot be made in the interposer, it is preferred to use a three layer interposer apparatus as shown in FIG. 5. As in the two layer interposer 26 shown in FIG. 4, a vacuum chuck apparatus shown generally as 11 comprises a base 12 forming an open vacuum area 13 therein. A vacuum 14 when applied to vacuum chuck 11 provides a downward vacuum force in open area 13 as shown by arrows A. The three layer interposer is shown generally as 30 and comprises a lower layer 23 comprising a plurality of vertical through holes 18d and non-communicating horizontal channels 25 extending from one end of the lower layer to the other end and terminating at a vent 24. An intermediate layer 31 is disposed on the surface of lower layer 23 and comprises a plurality of vertical through holes 18c which communicate with horizontal channels 32. The horizontal channels 32 extend to vertical through hole openings 18b of upper layer 21 of interposer 30. The intermediate layer 31 also comprises a series of vertical through holes 22a which communicate with horizontal channels 25. The upper layer 21 of interposer 30 comprises a plurality of vertical through openings 18b which communicate with horizontal channel 32 of intermediate layer 31. Another series of vertical through holes 22 in upper layer 21 communicate with vertical through holes 22a of intermediate layer 31. A porous sheet 15 is then positioned on the top of upper layer 21. A greensheet 16 having via openings 18a and open area 19a is positioned on the surface of porous sheet 15. A screen 20 comprising a plurality of via openings 18 is positioned on the surface of greensheet 16. The screen while not having a pervious area 19 over open area 19a of greensheet 16 will, without the interposer 30 and/or porous membrane 15 of the invention, be pulled into open area 19a when a vacuum is applied as shown by downward arrows B.

In operation, when a screening material to be applied to the greensheet is placed on the surface of screen 20 and forced through openings 18 using, for example, a squeegee, the material will fill vias 18a and not go past the surface of porous sheet 15 to the underside of greensheet 16. The screen at area 19 will not bow appreciably into open area 19a of greensheet 16 because any vacuum leakage within the assembly is vented to the atmosphere at opening 24 by vertical through openings 22 and 22a and horizontal channels 25. On the other hand, vertical through holes 18b, 18c and 18d of interposer 30 are in communication with vias 18a and screen via openings 18 by horizontal channels 32 of intermediate layer 31. The vacuum, therefore, will provide a downward force through openings 18, 18a, 18b, through horizontal channels 32 which are in communication with vertical openings 18c, 18d and vacuum area 13. Using a three layer interposer of the invention as shown in FIG. 5, it is possible to screen greensheets having a complex circuitry and a high density of via openings and is preferred to the two layer interposer as shown in FIG. 4 for these purposes.

The porous membrane may be made of any suitable material through which a vacuum can be applied such as a paper or fabric. The membrane is typically 1 to 3 mil thick and able to maintain intimate contact between the greensheet and vacuum apparatus and between the greensheet and interposer apparatus of the invention if used.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for fabricating greensheets by a screen printing process comprising:

supplying a vacuum chuck;

positioning a two-layer interposer on the vacuum chuck, the interposer comprising:

a lower layer having a plurality of horizontal first channels extending to at least one end of the lower layer which end is open to the atmosphere and a plurality of first vertical through openings with the first channels and first vertical through openings separate and not communicating with each other; and an upper layer having a plurality of second vertical through openings and third vertical through openings, the first vertical through openings and second vertical through openings being in registration and communicating with the vacuum of the vacuum chuck and the vias of the greensheet and the third vertical through openings communicating with the horizontal first channels and the open area of the greensheet;

positioning a greensheet on the interposer;

positioning a patterned screen having openings therein on the greensheet;

applying a metallic paste to the surface of the screen; and applying a vacuum to the vacuum chuck and forcing the metallic paste through the openings in the screen and forming the desired pattern on the greensheet.

2. The method of claim 1 wherein a porous membrane is positioned between the upper layer of the interposer and the greensheet.

3. A method for fabricating greensheets by a screen printing process comprising:

supplying a vacuum chuck;

positioning a three-layer interposer on the vacuum chuck, the interposer comprising:

a lower layer having a plurality of horizontal first channels extending to at least one end of the lower layer which end is open to the atmosphere and a plurality of first vertical through openings, the channels and vertical through openings not communicating and the first vertical through openings communicating with the vacuum of the vacuum chuck;

an intermediate layer having a plurality of horizontal second channels, a plurality of communicating vertical openings extending to the channels and to the opposed layer of the intermediate layer and a plurality of intermediate vertical through openings communicating with the first channels; and an upper layer having a plurality of second vertical through openings and a plurality of third vertical through hole openings, the second vertical through hole openings communicating with the horizontal second channels and in registration with the vias of the greensheet and the third vertical through hole openings in registration with the intermediate vertical through hole openings and in communication with the open area of the greensheet;

positioning a greensheet on the interposer;

positioning a patterned screen having openings therein on the greensheet;

applying a metallic paste to the surface of the screen; and applying a vacuum to the vacuum chuck and forcing the metallic paste through the openings in the screen and forming the desired pattern on the greensheet.

4. The method of claim 3 wherein a porous membrane is positioned between the upper layer of the interposer and the greensheet.

5. An apparatus for screen printing a substrate such as a greensheet having vias and/or an open area and vias comprising:

a vacuum chuck for applying a vacuum to the greensheet;

a two-layer interposer disposed on the vacuum chuck comprising:

a lower layer having a plurality of horizontal first channels extending to at least one end of the lower layer which end is open to the atmosphere and a plurality of first vertical through openings with the first channels and first vertical through openings separate and not communicating with each other; and an upper layer having a plurality of second vertical through openings and third vertical through openings, the first vertical through openings and second vertical through openings being in registration and communicating with the vacuum of the vacuum chuck and the vias of the greensheet and the third vertical through openings communicating with the horizontal first channels and the open area of the greensheet;

a substrate to be screen printed disposed on the upper surface of the upper layer of the two-layer interposer;

a patterned screen having the desired pattern to be printed on the substrate disposed on the upper surface of the substrate; and application means to force a paste through the patterned screen forming the screen pattern on the substrate.

6. The apparatus of claim 1 wherein a porous membrane is between the upper layer of the interposer and the greensheet.

7. The apparatus of claim 6 wherein the porous membrane is paper or a fabric.

8. An apparatus for screen printing a greensheet having vias and/or an open area and vias comprising:

a vacuum chuck for applying a vacuum to the greensheet; and a three layer interposer disposed on the vacuum chuck comprising:

a lower layer having a plurality of horizontal first channels extending to at least one end of the lower layer which end is open to the atmosphere and a plurality of first vertical through openings not communicating and the first vertical through openings communicating with the vacuum of the vacuum chuck;

an intermediate layer having a plurality of horizontal second channels, a plurality of communicating vertical openings extending tot he channels and to the opposed layer of the intermediate layer and a plurality of intermediate vertical through openings communicating with the first channels; and an upper layer having a plurality of second vertical through openings and a plurality of third vertical through hole openings, the second vertical through hole openings communicating with the horizontal second channels and in registration with the vias of the greensheet and the third vertical through hole openings in registration with the intermediate vertical through hole openings and in communication with the open area of the greensheet;

a substrate to be screen printed disposed on the upper surface of the upper layer of the three layer interposer;

a patterned screen having the desired pattern to be printed on the substrate disposed on the upper surface of the substrate; and application means to force a paste through the patterned screen forming the screen pattern on the substrate.

9. The apparatus of claim 8 wherein a porous membrane is between the upper layer of the interposer and the greensheet.

10. The apparatus of claim 9 wherein the porous membrane is paper or a fabric.

* * * * *

UNITED STATES PATENT AND TRADEMARK OFFICE
CERTIFICATE OF CORRECTION

PATENT NO. : 5,927,193
DATED : July 27, 1999
INVENTOR(S) : James G. Balz et al.

It is certified that error appears in the above-identified patent and that said Letters Patent is hereby corrected as shown below:

In column 5, line 48, after "openings" insert -- and --.
In column 7, line 23, after "positioned" delete "on".

In the Claims

In claim 8, column 10, line 64, delete "tot he" and substitute therefor -- to the --.

Signed and Sealed this

Twenty-eighth Day of December, 1999

Q. TODD DICKINSON

Attest:

Attesting Officer

Acting Commissioner of Patents and Trademarks